United States Patent [19]

Ito et al.

[11] Patent Number: 5,162,750
[45] Date of Patent: Nov. 10, 1992

[54] BAND LIMITER WITH TEMPERATURE COMPENSATION CIRCUIT

[75] Inventors: Takeshi Ito; Masao Izawa, both of Kawasaki, Japan

[73] Assignee: Kikusui Electronics Corporation, Kanagawa, Japan

[21] Appl. No.: 778,377

[22] Filed: Oct. 17, 1991

[30] Foreign Application Priority Data

Oct. 18, 1990 [JP] Japan .................................. 2-277848

[51] Int. Cl.$^5$ .............................................. H03F 3/45
[52] U.S. Cl. ................................... 330/256; 330/303; 330/305; 330/306
[58] Field of Search .............. 330/256, 289, 303, 305, 330/306

[56] References Cited

U.S. PATENT DOCUMENTS 4,782,305 11/1988 Westwick et al. ................. 330/306

FOREIGN PATENT DOCUMENTS 59-43008 10/1984 Japan .

*Primary Examiner*—James B. Mullins
*Attorney, Agent, or Firm*—Finnegan, Henderson, Farabow, Garrett and Dunner

[57] ABSTRACT

A band limiter connected between output lines of a differential amplifier. The band limiter includes a bipolar transistor connected to the output lines via capacitors, and includes a temperature detecting device for detecting ambient temperature. Transistor capacitance is connected to or disconnected from the output lines in response to a bandwidth limiting signal. The transistor constitutes a low-pass filter functioning as a band limiter when it is closed, whereas it functions as a variable capacitor which varies its capacitance in accordance with the ambient temperature when it is opened. The high-band frequency characteristic of the differential amplifier is temperature compensated by the transistor functioning as a variable capacitance.

4 Claims, 4 Drawing Sheets

$\begin{cases} C\pi \gg C\mu \\ C_F \gg C\mu \end{cases}$

BAND LIMITER WITH TEMPERATURE COMPENSATION CIRCUIT

BACKGROUND OF THE INVENTION

1. Field of the Invention

The present invention relates to a band limiter that is capable of limiting a pass-band of of an output signal of an amplifier so that only a low frequency component of the output signal is passed when the band limiter is in operation, and in particular, related to a band limiter including a temperature compensation circuit for compensating the high frequency characteristic of the amplifier for temperature changes when the band limiter is not in operation.

2. Description of the Related Art

Band limiters are applied to various apparatuses such as oscilloscopes. For example, in an oscilloscope, a band limiter is used for narrowing a pass-band of a signal in order to eliminate noises in a waveform to be observed. Such a band limiter is connected to an output terminal of a vertical amplifier whose frequency characteristic is as shown in FIG. 1A, so that the frequency characteristic of the output of the vertical amplifier is changed to that as shown in FIG. 1B.

When a waveform including step-like transitions is observed by the oscilloscope, however, the band limiter will round the waveform as shown in FIG. 2A. Accordingly, to observe such waveforms, the band limiter is generally disconnected from the output of the vertical amplifier.

The vertical amplifier disconnected from the band limiter, however, changes its high frequency characteristics in accordance with ambient temperature in the oscilloscope. For example, when the temperature increases, attenuation in the high frequency band generally increases as indicated by a dashed-and-dotted line of FIG. 1C, whereas when the temperature decreases, attenuation in the high frequency band decreases as indicated by a broken line in FIG. 1C. Consequently, a step-like transition of a waveform will round as shown in FIG. 2B when the temperature increases, whereas it will overshoot or undershoot as shown in FIG. 2C when the temperature decreases.

To prevent these rounding, overshoot and undershoot, a conventional oscilloscope incorporates a compensation circuit for canceling changes in high frequency characteristics according to temperature changes, in addition to the band limiter. This compensation circuit enables a waveform to be correctly displayed on a CRT as shown in FIG. 2D.

The compensation circuit comprises a thermo-sensitive device, a variable resistor and a variable capacitor which are controlled by an output signal of the thermo-sensitive device. Typically, a thermistor is used as the thermo-sensitive device, a field-effect transistor is employed as the variable resistor, and a small capacitance varicap as used as the variable capacitor.

The conventional compensation circuit, however, has the following problems.

First, careful circuit design is required because of strict circuit design conditions imposed on such a high frequency circuit. Second, the direct current voltage applied to the compensation circuit must be carefully handled so that it does no harm to the output signal of the vertical amplifier.

SUMMARY OF THE INVENTION

Accordingly, it is an object of the present invention to provide a band limiter including a reliable temperature compensation circuit that can be designed more easily than a conventional one.

It is another object of the present invention to provide a band limiter including a temperature compensation circuit of lower cost than a conventional band limiter including a temperature compensation circuit by sharing components between a temperature compensation circuit and a band limiter.

The present invention provides a band limiter connected between output lines of a differential amplifier, which comprises:

a first output terminal;

a second output terminal;

a first resistor connected between an output terminal of the differential amplifier and the first output terminal;

a second resistor connected between the other output terminal of the differential amplifier and the second output terminal;

a transistor whose base terminal is grounded;

a first capacitor whose first terminal is connected to an emitter terminal of the transistor, and whose second terminal is connected to the first output terminal;

a second capacitor whose first terminal is connected to a collector terminal of the transistor, and whose second terminal is connected to the second output terminal;

on-off means connected to the emitter terminal of the transistor for switching bandwidth of the band limiter;

temperature detecting means for detecting ambient temperature and for producing from an output terminal an output voltage varying in accordance with the ambient temperature; and a third resistor connected between the output terminal of the temperature detecting means and the collector terminal of the transistor.

Here, the temperature detecting means may comprise a fixed resistor whose first terminal is grounded, and a negative temperature coefficient thermistor whose first terminal is connected to a second terminal of the fixed resistor, and whose second terminal is connected to a voltage source, wherein the first terminal of the negative temperature coefficient thermistor is connected to the collector of the transistor via the third resistor.

The base of the transistor may be grounded via a fourth resistor.

The base of the transistor may be grounded via an inductor.

The present invention bases on the fact that a small collector capacitance of a bipolar transistor can be controlled by an applied voltage.

In the band limiter of the present invention, the first and second capacitors are connected between the differential signal lines when the transistor is conductive (in the operation mode of the limiter), thus operating as a normal band limiter.

On the other hand, when the transistor is non-conductive (in the non-operation mode of the limiter), the collector capacitance is connected in series with the first and second capacitors, and the transistor capacitance control means adjust the small collector capacitance by changing a direct current voltage applied to the collector. Thus, the transistor functions as a small variable capacitor so that necessary high-band compensation is easily carried out. In this case, the capacitors connected in series with the transistor prevents the direct current voltage applied to the transistor from interfering with the output signal from the amplifier.

The above and other objects, effects, features and advantages of the present invention will become more apparent from the following description of the embodiment thereof taken in conjunction with the accompanying drawings.

DETAILED DESCRIPTION OF PREFERRED EMBODIMENTS

The invention will now be described with reference to the accompanying drawings.

Figure 3:
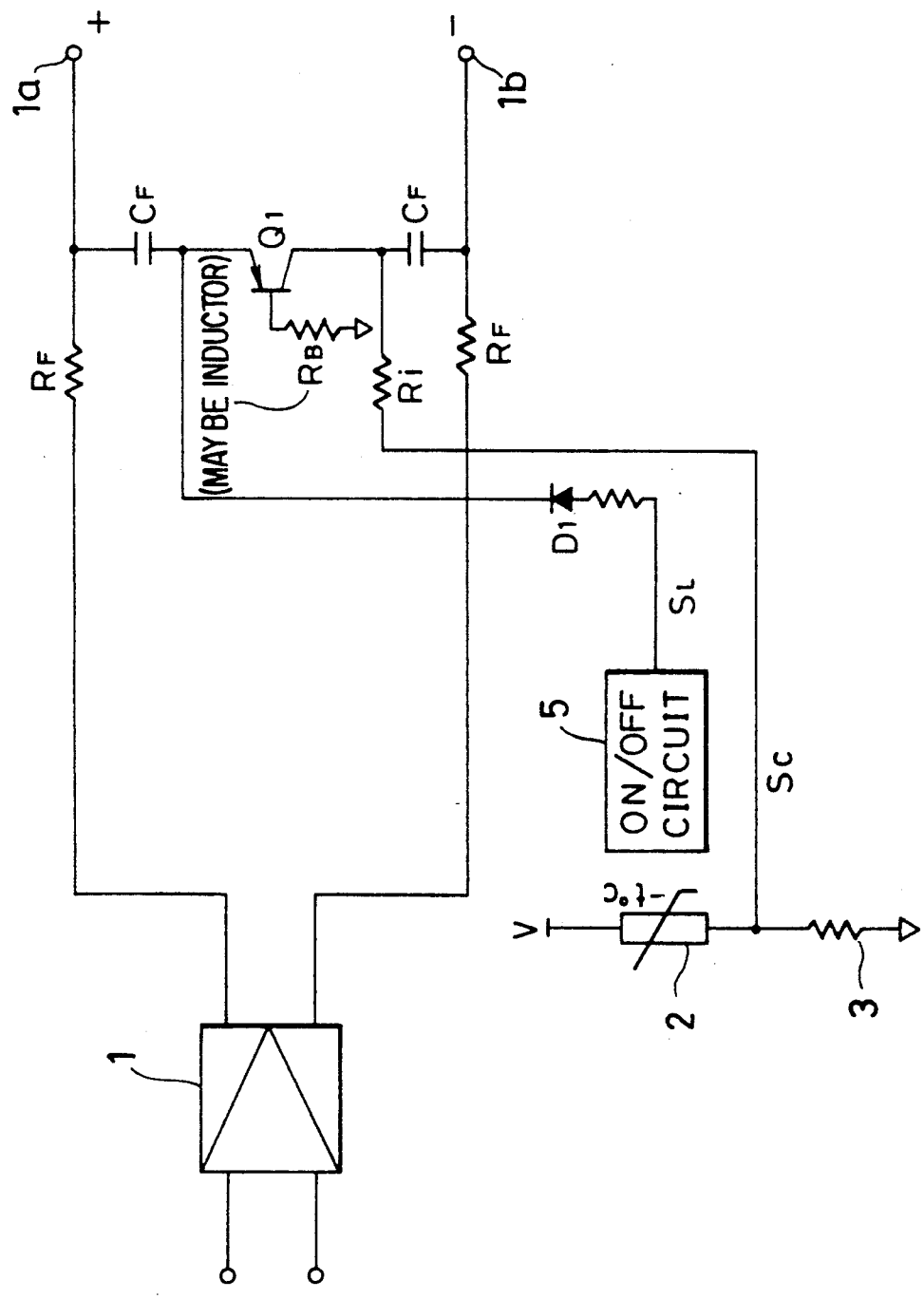
FIG. 3 is a circuit diagram showing an arrangement of a band limiter as an embodiment of the present invention.

FIG. 3 is a circuit diagram showing an embodiment of the present invention. In this figure, reference numeral 1 designates a differential amplifier as a vertical amplifier of an oscilloscope. The differential amplifier has two output lines, each of which is connected to a terminal of a resistor $R_F$. The other terminals of the two resistors $R_F$ are connected to a first and a second output terminals 1a and 1b of a band limiter, respectively. Across the first and second output terminals, a serial circuit of a first capacitor $C_F$, a bipolar transistor Q1 and a second capacitor $C_F$ is connected. More specifically, the first capacitor $C_F$ is connected between the emitter of the transistor Q1 and the first output terminal 1a, and the second capacitor $C_F$ is connected between the collector of the transistor Q1 and the second output terminal 1b. The base of the transistor Q1 is grounded through a resistor $R_B$. Here, each resistor $R_F$ and capacitor $C_F$ constitute a filter for the band limiter, and typical values of these are, for example, $R_F=27$ Ω and $C_F=220$ pF so that only frequency components lower than 20 MHz can pass the filters.

To the emitter of the transistor Q1 is applied a bandwidth limiting ON/OFF signal $S_L$ from an ON/OFF circuit 5 through a diode D1 so that the transistor becomes conductive/non-conductive in response to ON/OFF of the signal. The ON/OFF circuit 5 produces a high-level ON signal and a low-level OFF signal in accordance with the presence and absence of the band-limiting command from a switch manually controlled by an operator. As the bandwidth limiting ON/OFF signal $S_L$, a high/low signal of the TTL level can be used. The resistor $R_B$ can be replaced by an inductor.

To the collector of the transistor Q1 is applied a high-band compensation signal $S_C$ through a high resistance resistor Ri (for example, look Ω). The high-band compensation signal is a voltage which is generated by dividing a direct current voltage V with a dividing circuit composed of a negative temperature coefficient thermistor 2 and a resistor 3. Accordingly, the high-band compensation signal $S_C$ increases consistently wtih the increase in the temperature detected by the thermistor 2.

Figure 4:
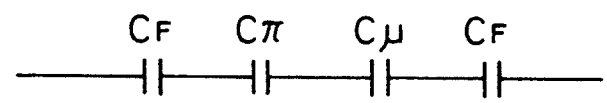
FIG. 4 is a diagram for explaining a combined capacitance of capacitors connected in series wtih the transistor capacitance.
Figure 4:
Figure 4:
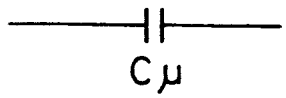

Next, the operation when the transistor Q1 is non-conductive (in the non-operation mode of the limiter) is explained. The transistor Q1 is turned off by setting the bandwidth limiting ON/OFF signal $S_L$ at a low level. In this case, the serial circuit of the capacitor $C_F$, the transistor Q1, and the capacitor $C_F$ is equivalent to a serial circuit as shown in FIG. 4. This serial circuit is composed of an input capacitance (emitter-base interterminal capacitance) $C_\pi$ and a feedback capacitance (collector-base interterminal capacitance) $C_\mu$ which are connected in series with the capacitors $C_F$.

Figure 1A:
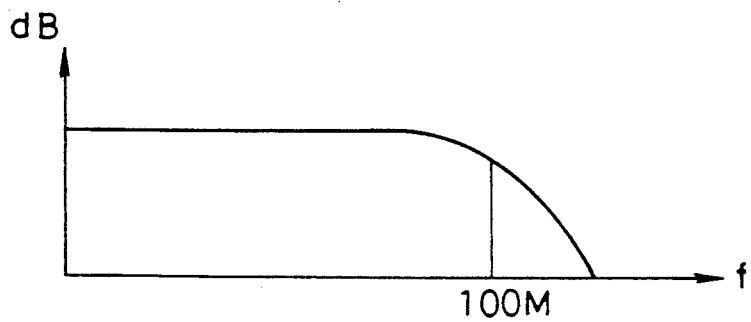
FIG. 1A is a diagram illustrating a frequency characteristic of an output of a vertical amplifier.

Since the feedback capacitance $C_\mu$ is very small ($C_\mu << C_\pi$, and $C_\mu << C_F$), the combined capacitance of the serial circuit is approximately equal to the capacitance of the feedback capacitance $C_\mu$ as shown in FIG. 4. In the non-conductive state of the transistor Q1, the feedback capacitance $C_\mu$ varies in accordance with a high-band compensation signal $S_c$. Consequently, this embodiment functions as a temperature compensation circuit compensating a frequency characteristic of the vertical amplifier, as shown in FIG. 1A.

Figure 5:
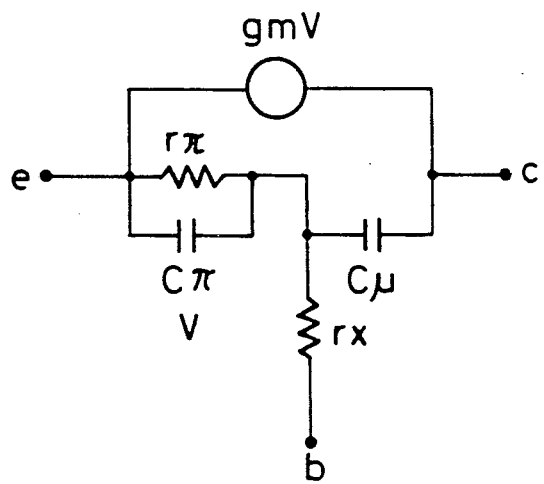
FIG. 5 is a diagram showing an equivalent circuit of a transistor of FIG. 3.

This will be explained in more detail. FIG. 5 is a diagram showing an equivalent circuit of a common base bipolar transistor. As clear from this figure, the common base transistor is considered to have capacitances $C_\pi$ and $C_\mu$ serially connected across the emitter e and the collector c.

Figure 6:
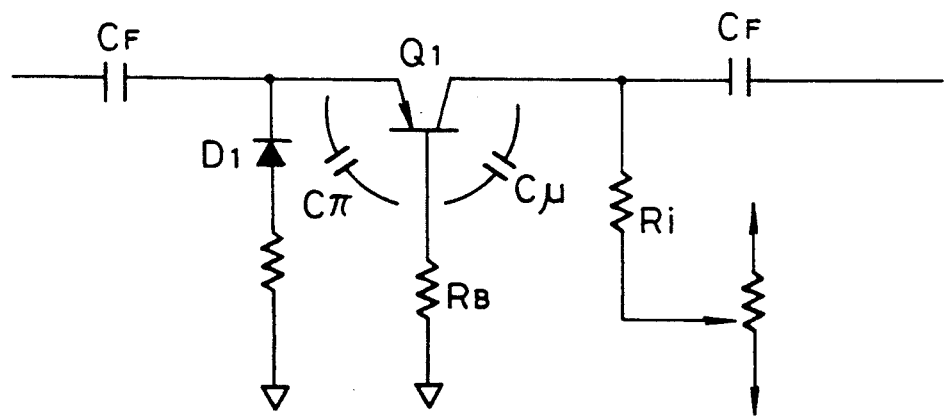
FIG. 6 is a diagram for explaining the operation of the band limiter of the embodiment shown in FIG. 3.

Accordingly, when the transistor Q1 is non-conductive, it is considered that for a signal above 100 MHz, a circuit as shown in FIG. 6 is connected between the two output lines of the amplifier 1. In other words, it is considered that the two capacitances $C_\pi$ and $C_\mu$ are serially connected with the two capacitors $C_F$ across the two output lines.

Here, the value of the input capacitance $C_\pi$ at the input side is tens of picofarads to hundreds of picofarads, whereas the value of the feedback capacitance $C_\mu$ is a few picofarads, and they can be expressed as follows:

$$C_\pi = C_{je} + C_b$$

$$C_\mu = C_{jc} + C_d$$

where $C_{je}$ is an emitter junction capacitance, $C_{jc}$ is a collector junction capacitance, $C_b$ is a base charging capacitance, and $C_d$ is a collector diffusion capacitance. Further, a junction capacitance $C_j$ of a bipolar transistor is generally expressed as follows:

$$C_j = K(\Phi_o - V)^{-n}$$

where K is a fixed value, $\Phi_0$ is a contact potential difference, V is a bias voltage applied to a junction, and n is a fixed value between 0 and ½ for an abrupt junction.

In the non-conductive state of the transistor Q1, the input capacitance $C_\pi$ maintains its value, and only the feedback capacitance changes its value. This is because, when the bandwidth limiting ON/OFF signal $S_L$ applied to the emitter of the transistor Q1 is low so that the transistor Q1 is non-conductive, and when the high-band compensation signal $S_c$ (a direct current voltage) is applied to the collector of the transistor Q1, the base-to-emitter voltage $V_{be}$ is fixed, and only the base-to-collector voltage $V_{bc}$ varies in response to the high-band compensation signal $S_c$. In other words, in the non-conductive state of the transistor Q1, only the feedback capacitance $C_\mu$ changes with maintaining the input capacitance $C_\pi$ at a fixed value. The value of the feedback capacitance declines as the magnitude of the high-band compensation signal $S_c$ increases.

Thus, when the transistor Q1 is non-conductive, the circuit of this embodiment functions as a temperature compensation circuit only for a high frequency signal, for example, above 100 MHz, and has no effect on the signal below this frequency. This is because the feedback capacitance $C_\mu$ which varies in accordance with the high-band compensation signal $S_c$ is very small.

Next, the operation of this embodiment thus constructed will be described.

Figure 1B:
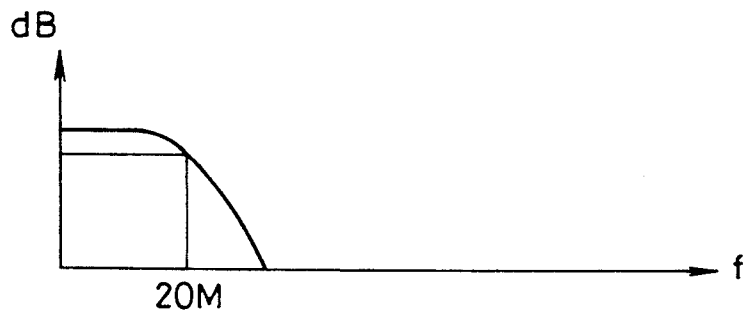
FIG. 1B is a diagram illustrating a frequency characteristic of an output of a conventional band limiter when the limiter is in the operation mode.
Figure 1C:
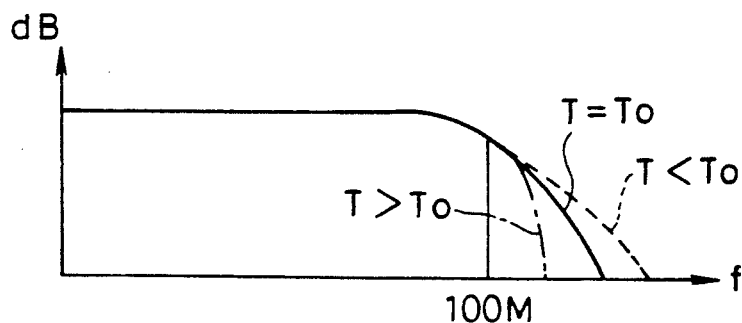
FIG. 1C is a diagram illustrating a frequency characteristic of the output of the vertical amplifier when the limiter is in the non-operation mode and ambient temperature changes.

First, when the bandwidth limiting ON/OFF signal $S_L$ is a high level, the transistor Q1 becomes conductive so that the resistors $R_F$ and capacitors $C_F$ configure low-pass filter with low cutoff frequency. Consequently, the circuit of this embodiment works as a band limiter, and eliminates frequency components above 20 MHz of the differential input signal, as shown in FIG. 1B.

Second, when the bandwidth limiting ON/OFF signal $S_L$ is at a low level, the transistor Q1 becomes non-conductive. In this case, the circuit of this embodiment functions as a temperature compensation circuit including the resistors $R_F$ and the capacitance $C_\mu$ whose value varies in response to the high-band compensation signal $S_c$ which is applied to the collector of the transistor Q1 and varies in accordance with the temperature. As a result, the capacitance $C_\mu$ varies in accordance with the change in temperature so that the frequency characteristic above 100 MHz of the circuit is compensated wtih regard to the temperature.

More specifically, the voltage of the high-band compensation signal $S_c$ increases consistently with the temperature rise, which declines the feedback capacitance $C_\mu$. As a result, when the attenuation of a vertical amplifier of an oscilloscope increases in the high-band owing to the temperature rise, this circuit functions so as to decrease the attenuation, thereby compensating the change in the frequency characteristic of the vertical amplifier. In contrast, the voltage of the high-band compensation signal $S_c$ decreases with the temperature fall, which augments the value of the feedback capacitance $C_\mu$. Consequently, when the attenuation of the vertical amplifier decreases in the high-band owing to the temperature fall, this circuit functions so as to increase the attenuation of the vertical amplifier, thereby compensating the change in the frequency characteristic of the vertical amplifier.

Thus, the change of the high-band frequency characteristic of the vertical amplifier of an oscilloscope due to temperature changes can be compensated. In this case, the high-band compensation signal $S_c$ which is a direct current voltage does not interfere with the differential input signal because of the capacitances $C_F$. In addition, the high-band compensation signal $S_c$ does not interfere with the frequency components below 100 MHz because of the high resistance of the register $R_i$.

Figure 2A:
FIGS. 2A-2C are diagrams illustrating waveforms of the output of the conventional band limiter.
Figure 2B:
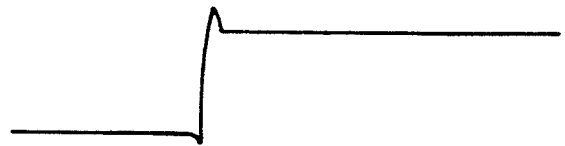
Figure 2C:
Figure 2D:
FIG. 2D is a diagram illustrating a waveform of an output of a band limiter of the present invention.

As a result, incorporating the circuit of this embodiment into a vertical amplifier of an oscilloscope makes it possible to reproduce an observed waveform correctly as shown in FIG. 2D, for example. The waveform suffers no adverse effect of the temperature change even when the bandwidth limiting is in the off state because the high-band frequency characteristic of the circuit is temperature compensated.

The present invention has been described in detail with respect to an embodiment, and it will now be apparent from the foregoing to those skilled in the art th: changes and modifications may be made without departing from the invention in its broader aspects, and it is the intention, therefore, in the appended claims to cover all such changes and modifications as fall within the true spirit of the invention.

What is claimed is:

1. A band limiter connected between output lines of a differential amplifier, which comprises:
    a first output terminal;
    a second output terminal;
    a first resistor connected between an output terminal of the differential amplifier and said first output terminal;
    a second resistor connected between the other output terminal of the differential amplifier and said second output terminal;
    a transistor whose base terminal is grounded;
    a first capacitor whose first terminal is connected to an emitter terminal of the transistor, and whose second terminal is connected to said first output terminal;
    a second capacitor whose first terminal is connected to a collector terminal of said transistor, and whose second terminal is connected to said second output terminal;
    on-off means connected to the emitter terminal of said transistor for switching bandwidth of said band limiter;
    temperature detecting means for detecting ambient temperature and for producing from an output terminal an output voltage varying in accordance with the ambient temperature; and
    a third resistor connected between the output terminal of said temperature detecting means and the collector terminal of said transistor.

2. A band limiter as claimed in claim 1, wherein said temperature detecting means comprises a fixed resistor whose first terminal is grounded, and a negative temperature coefficient thermistor whose first terminal is connected to a second terminal of said fixed resistor, and whose second terminal is connected to a voltage source, wherein the first terminal of said negative temperature coefficient thermistor is connected to the collector of said transistor via the third resistor.

3. The band limiter as claimed in claim 1, wherein the base of said transistor is grounded via a fourth resistor.

4. The band limiter as claimed in claim 1, wherein the base of said transistor is grounded via an inductor.

* * * * *